United States Patent [19]
Bushman et al.

[11] Patent Number: 5,414,354
[45] Date of Patent: May 9, 1995

[54] APPARATUS AND METHOD FOR GENERATING A SUBSTANTIALLY RECTANGULAR OUTPUT SIGNAL

[75] Inventors: Michael L. Bushman, Hanover Park; Kenneth C. Fuchs, Winfield, both of Ill.

[73] Assignee: Motorola, Inc., Schaumburg, Ill.

[21] Appl. No.: 103,843

[22] Filed: Aug. 9, 1993

[51] Int. Cl.$^6$ .................................. H03K 12/00
[52] U.S. Cl. ............................ 327/184; 327/74; 327/104
[58] Field of Search ............ 307/261, 268, 264, 360, 307/228; 328/13, 28, 36

[56] References Cited

U.S. PATENT DOCUMENTS

| | | | |
|---|---|---|---|
| 3,497,723 | 2/1970 | Nelson | 307/268 |
| 3,639,779 | 2/1972 | Garrigus | 307/360 |
| 4,794,283 | 12/1988 | Allen et al. | 307/360 |
| 4,859,873 | 8/1989 | O'Shaughnessy | 307/360 |

Primary Examiner—Timothy P. Callahan
Assistant Examiner—Toan Tran
Attorney, Agent, or Firm—John W. Hayes

[57] ABSTRACT

A squaring amplifier circuit (300) generates a substantially rectangular output signal from an a.c. input signal. An amplifier stage (303) is biased at a low quiescent current by a current source network (305) and a coupling network (306). Since the amplifier stage (303) current is a non-linear function of its input voltage, application of a low-level a.c. input signal (313), through an input signal coupling network (302), results in a substantially rectangular output signal having frequency and duty cycle that are substantially identical to the frequency and duty cycle of the input signal.

16 Claims, 5 Drawing Sheets

APPARATUS AND METHOD FOR GENERATING A SUBSTANTIALLY RECTANGULAR OUTPUT SIGNAL

FIELD OF THE INVENTION

This invention relates generally to low-current amplifier circuits, and in particular to amplifier circuits for recovery and distribution of stable, low-noise digital clock signals.

BACKGROUND OF THE INVENTION

Modern electronic equipment of all types, especially computing and communication equipment, depends more and more on microprocessors and digital logic circuitry to attain performance levels desired by consumers. Microprocessors and logic circuits generally require clock signals or timing signals for proper operation.

In order to provide the necessary timing and control information to a microprocessor or logic circuit, a clock signal must generally be a square wave signal with amplitude excursions that come as close as possible to the supply voltage at the point of maximum excursion, and ground potential at the point of minimum excursion. Of course, high amplitude square wave signals are difficult to distribute within communication equipment in particular, because square waves have a high harmonic content that can cause interference with adjacent circuitry.

In practice, it is common to distribute low amplitude sinusoidal a.c. (alternating current) clock signals to circuitry that may be sensitive to interference from square wave harmonics. Sensitive circuits of this type include frequency synthesizers used in communication equipment. One solution to this problem is to provide separate distribution systems for system timing signals.

This dual distribution concept gives rise to several potential problem areas. First, a method must be found for deriving high amplitude square wave clock signals from low-level a.c. input signals, so that the square wave clock and the a.c. signal will be the same frequency; having the frequencies be identical is important in many applications. It is also frequently important that the duty cycle of the square wave clock and the a.c. input signal be the same. Of course, noise immunity is virtually always an important design constraint, as well.

Size and power consumption are also important design considerations in any clock signal distribution scheme. With electronic equipment becoming smaller and smaller, and battery operation becoming a more popular feature, there is often little space or power to spare.

Prior designs have attempted to solve some of the problems set forth above. FIG. 1 illustrates one example of a squaring amplifier of the prior art, as generally depicted by the numeral 100. In this circuit, an a.c. input signal (101) is a.c. coupled through a capacitor (102) to the input of an inverter. The inverter consists of two complementary FET's (field effect transistors) (103 and 104) and is powered by a d.c. (direct current) supply voltage (105). A resistor (109) connects the input of the inverter to the output of the inverter (106). This resistor provides a quiescent operating point for the two transistors (103 and 104) The post-coupled input signal then has a d.c. potential that is at the cross-over threshold of the inverter. The drain current of each FET (103 and 104) is proportional to the square of its gate-to-source voltage. However, in the way that these element are connected in FIG. 1, the output current at the junction of the two FET's (106) is a linear function of the input voltage at their gates. As the input voltage increases, the p-channel FET's (103) drain current decreases and the n-channel FET's (104) drain current increases. The difference in these drain currents is the output (106). This current discharges the input capacitance of a load inverter (107). When the voltage on the input capacitance of the load inverter (107) falls below the inverter's threshold, the inverter's output goes to its high potential. When the voltage at the input of a subsequent inverter (108) goes above the inverter's threshold, the inverter's output goes to its low potential. These first inverters (107 and 108) and any subsequent inverters provide additional gain to produce a substantially rectangular output. When the input voltage decreases, the current flow at the junction node (106) is in the opposite direction, and outputs that are the converse of those discussed above occur. As the a.c. input signal transitions through the quiescent point, transitions are produced at the output of the second inverter (108) that is a substantially rectangular waveform. It is desirable that device geometries (103 and 104) be as large as possible to minimize noise effects. However, large device geometries increase current consumption when small a.c. input signals are applied.

Another prior art squaring amplifier is shown in FIG. 2 (and generally depicted by the numeral 200). In this circuit, an a.c. input signal (201) is a.c. coupled through a capacitor (202) to the input of an inverter. The inverter consists of two complementary FET's (203 and 204) and is powered by a d.c. supply voltage (205). A current source (206) is placed in series with the inverter (203 and 204) to limit the quiescent current consumption. A resistor (207) connects the input of the inverter to the output of the inverter. This resistor provides a quiescent operating point for the two transistors (203 and 204). The post-coupled input signal then has a d.c. potential that is at the cross-over threshold of the inverter (203 and 204). The drain current of each FET (203 and 204) is proportional to the square of its gate-to-source voltage. However, in the way that these elements are connected in FIG. 2, the output current at the input to inverter 208 is a linear function of the input voltage at the gates of 203 and 204 within the a.c input voltage range. As the input voltage increases, the p-channel FET's (203) drain current decreases and the n-channel FET's (204) current increases. The difference in these drain currents is the input to the inverter (208). This current discharges the input capacitance of the load inverter (208). When the voltage on the input capacitance of the load inverter (208) falls below the inverter's threshold, the inverter's output goes to its high potential. When the input voltage decreases, the current flow charges the input capacitance of the load inverter (208). When the voltage on the input capacitance of the load inverter (208) goes above the inverter's threshold, the inverter's output goes to a low potential equal to the source voltage of FET 204 which is determined by the current source (206). As the a.c. input signal transitions through the quiescent point, transitions are produced at the output of inverter (208) that is a substantially rectangular waveform. However, the substantially rectangular waveform does not reach ground potential. Level shifter circuitry (209) accepts the outputs of the FET combination (203 and 204) and the inverter (208) and increases the output waveform's voltage range to a maximum of the d.c supply voltage (205) and a minimum value of ground potential. The output of the level shifter, a substantially rectangular waveform, is further buffered by another inverter (210) to provide faster transition times in the waveform at the output (211). It is desirable that device geometries (203 and 204) be as large as possible to minimize noise effects. The addition of the current source (206) limits the current consumption of the circuit when a small a.c. input signal is applied, but requires the addition of the level shifting circuit (209) to produce the desired substantially rectangular output waveform.

It can thus be appreciated that squaring amplifier circuits of the prior art fall short of meeting design criteria dictated by electronic equipment in which small-size, low-power circuitry is desirable. Accordingly, a need arises for a squaring amplifier circuit producing a substantially rectangular output in response to a low-level a.c input signal, while ensuring that the output frequency and duty cycle duplicate that of the input signal. In addition, the squaring amplifier should occupy minimal space and use little power.

SUMMARY OF THE INVENTION

This need and others are satisfied by the squaring amplifier of the present invention, which comprises a biasing network including a current mirror and a coupling network operably coupled to the current source network to provide a first bias voltage and a second bias voltage. The squaring amplifier has an amplifier stage including a first transistor and a second transistor, with the first bias voltage coupled to the first transistor and the second bias voltage coupled to the second transistor to provide push-pull operation. The amplifier also includes an input signal coupling network, including a first coupling component and a second coupling component, that a.c. couples an a.c. input signal to the first transistor and the second transistor, respectively. A load is coupled to the amplifier stage, the load having an electrical reactance to provide a substantially rectangular output signal retaining input signal duty cycle of the a.c. input signal.

A method for practicing the invention is also described, in which a first transistor of an amplifier stage is biased at a first bias potential, and a second transistor of the amplifier stage is biased at a second bias potential. A quiescent current is established for the amplifier stage to provide a non-linear relationship between amplifier output current and the input signal voltage. Then, an a.c. input signal voltage is applied to the amplifier stage through first and second input signal a.c. coupling networks, and a substantially rectangular output voltage is generated from the a.c. input signal voltage, wherein the substantially rectangular output voltage has a substantially identical duty cycle to a duty cycle of the input signal voltage.

DESCRIPTION OF A PREFERRED EMBODIMENT

The following paragraphs describe in detail an apparatus and method devised by the inventors for generating a substantially rectangular output signal in a fashion that avoids the shortcomings revealed in the foregoing discussion of the background art. This invention operates on an a.c. input signal to produce a substantially rectangular output signal. The output signal retains a duty cycle identical to that of the a.c. input signal. Furthermore, this invention provides rejection of noise that may appear on the input signal, and operates with low current consumption.

Figure 3:
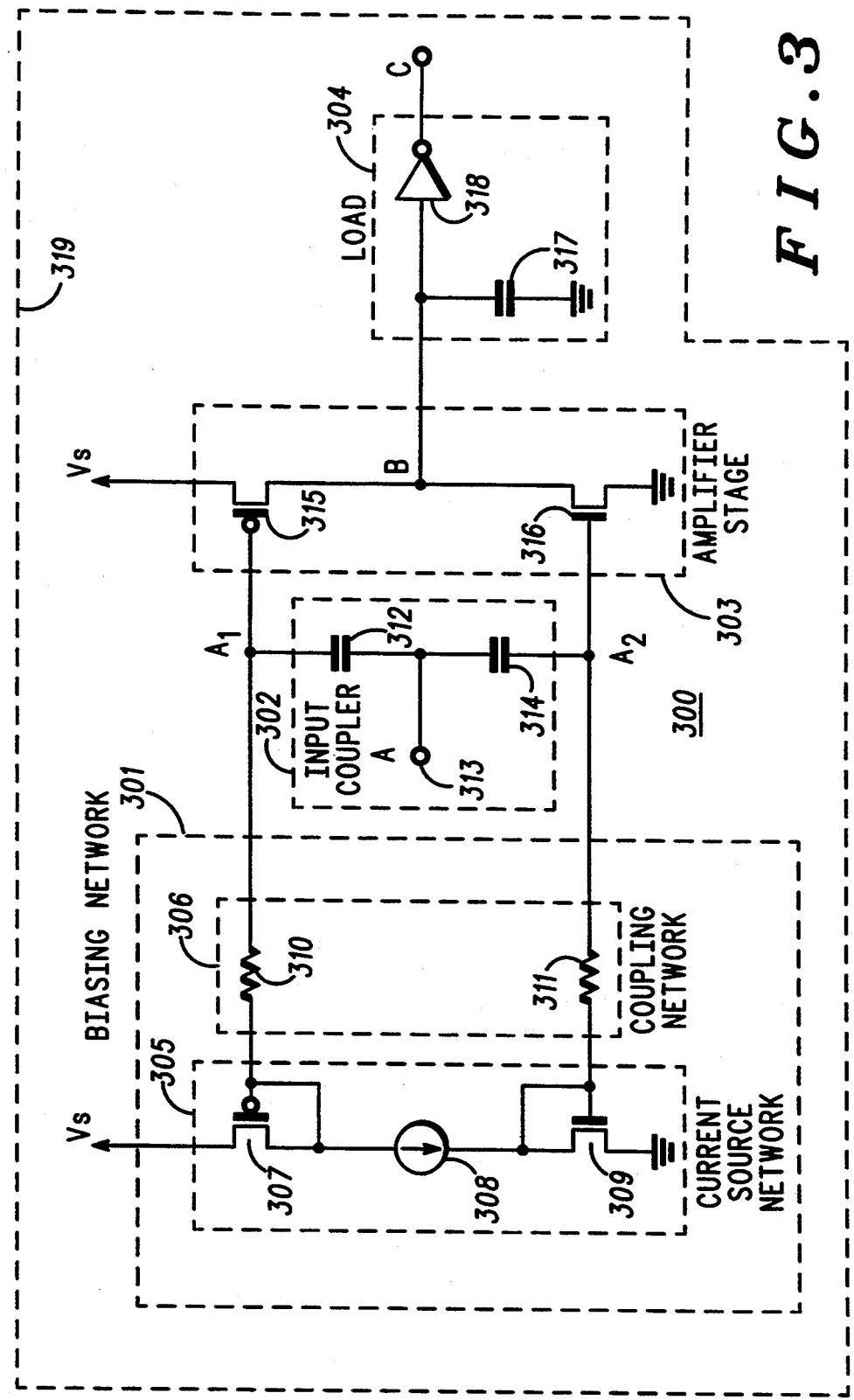
FIG. 3 is a schematic diagram of a squaring amplifier in accordance with the present invention.

The present invention may be more fully understood through an examination of drawing FIGS. 3 through 6. FIG. 3 is a schematic representation of the pertinent portions of a squaring amplifier circuit in accordance with the present invention. In this circuit, an a.c. input signal (313) is a.c. coupled through an input signal coupling network (302) having input signal coupling components. The coupling components are capacitors (312 and 314) that couple to the input of an amplifier stage (303) comprising two complimentary FET transistors (315 and 316) connected in a push-pull configuration. The amplifier stage (303) is powered by a d.c. supply (Vs) and biased by a biasing network (301). The output of the amplifier stage (303) is connected to a load (304), which is an inverter (318) with an intrinsic input capacitance (317). The biasing network (301) includes a current source network (305) and a coupling network (306). The current source network (305) comprises a diode-connected p-channel FET (307), a current source (308), and a diode-connected n-channel FET (309) connected in series.

Bias voltage 1 is produced at the gate of the p-channel FET (307) and bias voltage 2 is produced at the gate of the n-channel FET (309). Bias voltage 1 and bias voltage 2 are connected to the amplifier stage (303) through a coupling network (306). The coupling network (306) comprises a first resistor (310) and a second resistor (311). Since no d.c. path exists in the input signal coupling network (302) or the amplifier stage (303), no change in bias voltage 1 or bias voltage 2 occurs through the coupling network (306). However, since an a.c. path exists from the input signal coupling network (302) through the biasing network (301), the coupling network (306) minimizes a.c. input signal (313) through the a.c. path from the input signal coupling network (302) to the biasing network (301). The biasing configuration allows the biasing network (301) to determine the quiescent current in the amplifier stage (303).

Bias voltage 1 is generated at the gate of the p-channel FET (307) of the current source network and applied to the gate of the p-channel FET (315) within the amplifier stage (303). The drain current of the p-channel FET (315) in the amplifier stage is related to the drain current of the p-channel FET (307) in the current source network by the ratio of the device geometries of both p-channel FETs. Bias voltage 2 is generated at the gate of the n-channel FET (309) of the current source network and applied to the gate of the n-channel FET (316) of the amplifier stage (303). The drain current of the n-channel FET (316) of the amplifier stage is related to the drain current of the n-channel FET (309) of the current source network by the ratio of the device geometries of both n-channel FETs. Since the drain current of the p-channel FET (307) and the n-channel FET (309) is determined by the current source (308), this allows a small quiescent current for the p-channel FET (315) and the n-channel FET (316) of the amplifier stage independent of the size of these devices. It also allows the gain of the amplifier stage (303) to be determined independently of the quiescent current. At the quiescent operating point of the amplifier stage (303), the drain current of the p-channel FET (315) of the amplifier stage equals the drain current of the n-channel FET (316) of the amplifier stage, and each FET is biased near its threshold voltage. This minimizes the current consumption of the amplifier stage (303). Since the drain current of an FET is proportional to the square of its gate voltage, the amplifier stage (303) has a non-linear transconductance (output current/input voltage) characteristic.

The a.c. input signal (313) is applied to the input signal coupling network (302) and is passed by one of the coupling capacitors (312) to the gate of the p-channel FET (315) of the amplifier stage and is passed by the second coupling capacitor (314) to the gate of the n-channel amplifier FET (316). Coupling capacitor 312, coupling network resistor 310 coupling capacitor 314 and coupling network resistor 311 are scaled to provide for identical driving point impedances to be seen at the gate of the p-channel amplifier FET (315) and the gate of the n-channel amplifier FET (316). This prevents variations in the signals at the gates of the amplifier FETs (315 and 316) that would result in corruption of the duty cycle of the output waveform with respect to the duty cycle of the a.c. input signal.

As the input voltage increases, the p-channel FET's (315) drain current decreases and the n-channel FET's (316) drain current increases. The difference in these drain currents is the input to the load (304). Since the p-channel FET (315) is biased near its threshold, the change in its drain current is minimal as the voltage at the gate of the p-channel FET (315) begins to increase above bias voltage 1. However, as the voltage at the gate of the n-channel FET (316) begins to increase above bias voltage 2, the n-channel FET's (316) drain current increases according to the transconductance square-law. This current discharges the intrinsic input capacitance (317) of the load inverter (318). When the voltage on the intrinsic capacitance (317) of the load inverter (318) falls below the inverter's threshold, the inverter's output goes to its high potential.

As the input voltage decreases, the p-channel FET's (315) drain current increases and the n-channel FET's (316) current decreases. The difference in these drain currents is the input to the load (304). Since the n-channel FET (316) is biased near its threshold, the change in its drain current is minimal as the voltage at the gate of the n-channel FET (316) begins to decrease below bias voltage 2. However, as the voltage at the gate of the p-channel FET (315) begins to decrease below bias voltage 1, the p-channel FET's (315) drain current increases according to the transconductance square-law. This current charges the intrinsic input capacitance (317) of the load inverter (318). When the voltage on the input capacitance (317) of the load inverter (318) rises above the inverter's threshold, the inverter's output goes to its low potential. As the a.c. input signal, applied to the p-channel FET (315) and the n-channel FET (316), through the input signal coupling network (302), crosses through the bias voltage points, transitions are produced at the output of the inverter (318). The load inverter (318) adds additional gain to the circuit of FIG. 3 and can increase the slope of the transitions in the output waveform. The output waveform from the inverter (318) is substantially rectangular, retaining the duty cycle of the a.c. input signal.

As the signals applied to the amplifier FETs (315 and 316) cross through their respective bias voltages, only small changes in the amplifier stage (303) output current occur. As the signals applied to the amplifier FETs (315 and 316) deviate from their respective bias voltages, changes in the amplifier stage (303) output current become increasingly larger. Before the load capacitor (317) charges or discharges to the load inverter's (318) threshold, the signals applied to the amplifier FETs (315 and 316) will have deviated significantly from their respective bias voltages. Perturbations in the a.c. input signal (313), as applied to the gate of the p-channel FET (315) and the gate of the n-channel FET (316), must overcome this significant deviation from the respective bias voltages before the direction of the load capacitor (317) current can change. Changes in direction of current flow in the load capacitor (317), when its voltage is near the threshold of the load inverter (318), will cause transitions in the output waveform of the load inverter (318). This phenomenon, associated with the non-linear transconductance of the amplifier stage (303), improves the circuit's ability to reject additive noise which the a.c. input signal (313) is typically subject to. This improved noise immunity does not corrupt the retention of the a.c. input signal's (313) duty cycle in the substantially rectangular output's duty cycle as would occur in some prior art solutions.

As discussed previously, the squaring amplifier circuit (300) just described finds application in electronic equipment (symbolized by broken line 319) that includes circuitry requiring clock and timing information signals both in the form of a small amplitude a.c. sinusoid and a large amplitude square wave, where these two signals share identical frequency and duty cycle parameters. Such electronic equipment may be, for example, two-way radio communication equipment utilizing frequency synthesizers for generation of transmit and receive frequencies, and employing microprocessors or digital signal processors for control and signal processing functions.

Figure 4:
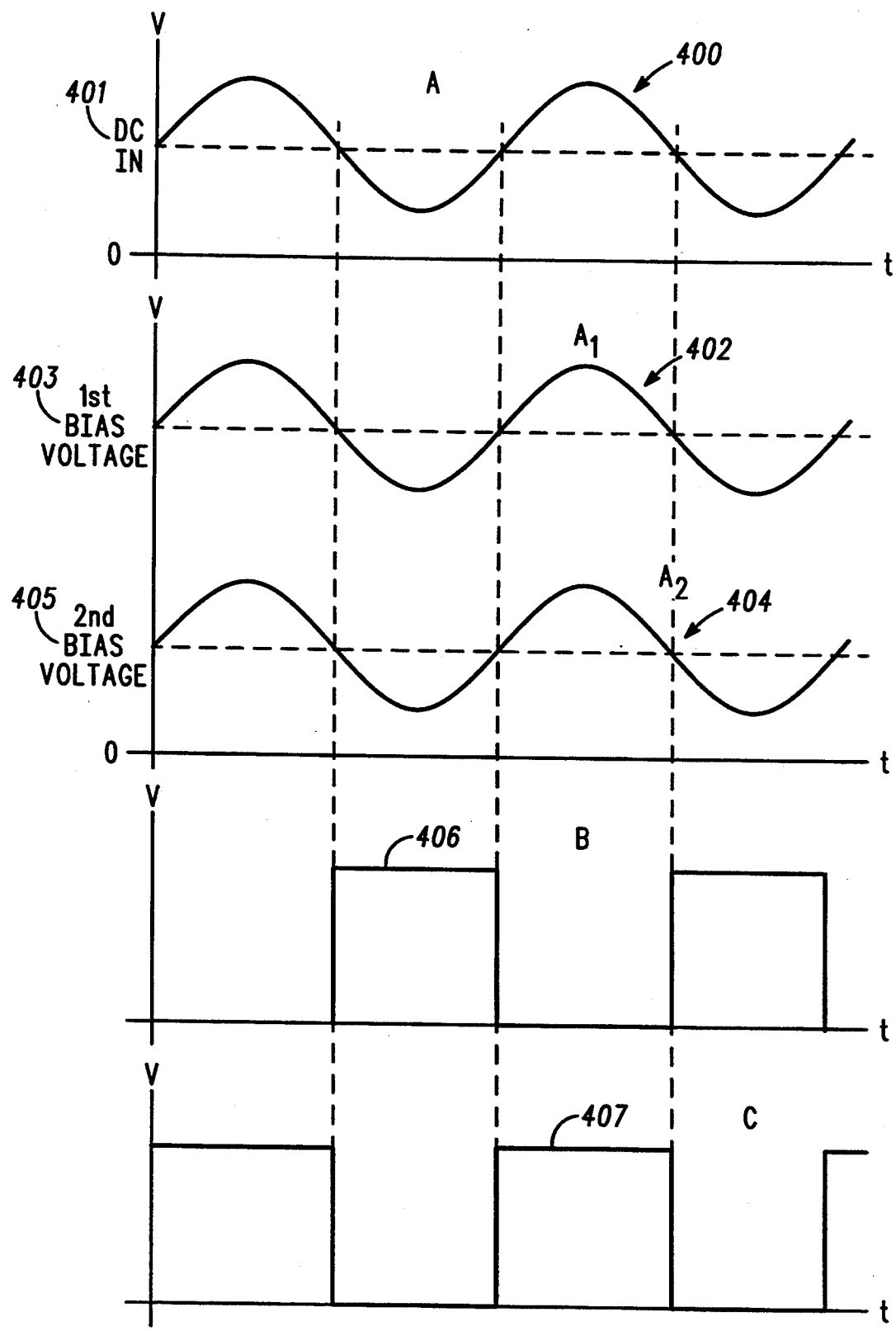
FIG. 4 depicts various waveforms observable within the circuit of FIG. 3.

FIG. 4 shows pertinent waveforms from the circuit of FIG. 3. A typical a.c. input signal (400) is shown in FIG. 4, as it appears at the input of the circuit. The mean value of the a.c. input signal (400) may vary and its amplitude is typically smaller than the amplitude of a desired substantially rectangular output waveform (407). Waveform 402 is seen at the gate of p-channel FET 315 (FIG. 3) and has a mean value (403) equal to bias voltage 1. Waveform 404 is seen at the gate of n-channel FET 316 (FIG. 3) and has a mean value (405) equal to bias voltage 2. Waveform 402 and waveform 404 are substantially identical to the a.c. input signal, waveform 400, due to the scaling of the input signal coupling network capacitors (312 and 314) and the coupling network resistors (310 and 311) (FIG. 3). Waveform 402 and waveform 404 retain the a.c. properties of the a.c. input signal (400), but their mean value has been altered to bias voltage 1 and bias voltage 2, respectively. This allows waveform 402, with substantially identical a.c. properties as the a.c. input waveform (400), but with mean value equal to the threshold voltage of p-channel FET 315, to be applied to the base of the p-channel FET (315), and waveform 404, with substantially identical a.c. properties as the a.c. input waveform (400), but with mean value equal to the threshold voltage of n-channel FET 316, to be applied to the base of the n-channel FET (316). Therefore, as the a.c. input signal transitions through its mean value with a negative slope, the drain current in the p-channel FET (315) will increase dramatically with respect to the drain current in the n-channel FET (316). And, as the a.c. input signal transitions through its mean value with a positive slope, the drain current in n-channel FET 316 will increase dramatically with respect to the drain current in p-channel FET 315. This produces the non-linear characteristics of the amplifier stage (303) transconductance (output current/input voltage).

The intermediate waveform (406) appears at the output of the amplifier stage (303). Since the amplifier stage (303) is basically an inverter configuration, it has negative gain. When the a.c. input waveform (400) transitions through its mean value from positive to negative, the output current from the amplifier stage (303) charges the load capacitor (317). The large transconductance of the amplifier stage (303), and the relatively small load capacitance (317) allows the capacitor (317) to fully charge to its maximum value in a time period which is a small fraction of the a.c input waveform's (400) duty cycle, thus producing a substantially rectangular negative to positive transition. When the a.c. input waveform (400) transitions through its mean value from negative to positive, the output current from the amplifier stage (303) discharges the load capacitor (317). The large transconductance of the amplifier stage (303), and the relatively small load capacitance (317) allows the capacitor (317) to fully discharge to its minimum value in a time period which is a small fraction of the a.c input waveform's (400) duty cycle, thus producing a substantially rectangular positive to negative transition. The substantially rectangular output waveform (407) is the inverted version of waveform 406. Waveform 407 can have transitions with greater slopes.

Figure 5:
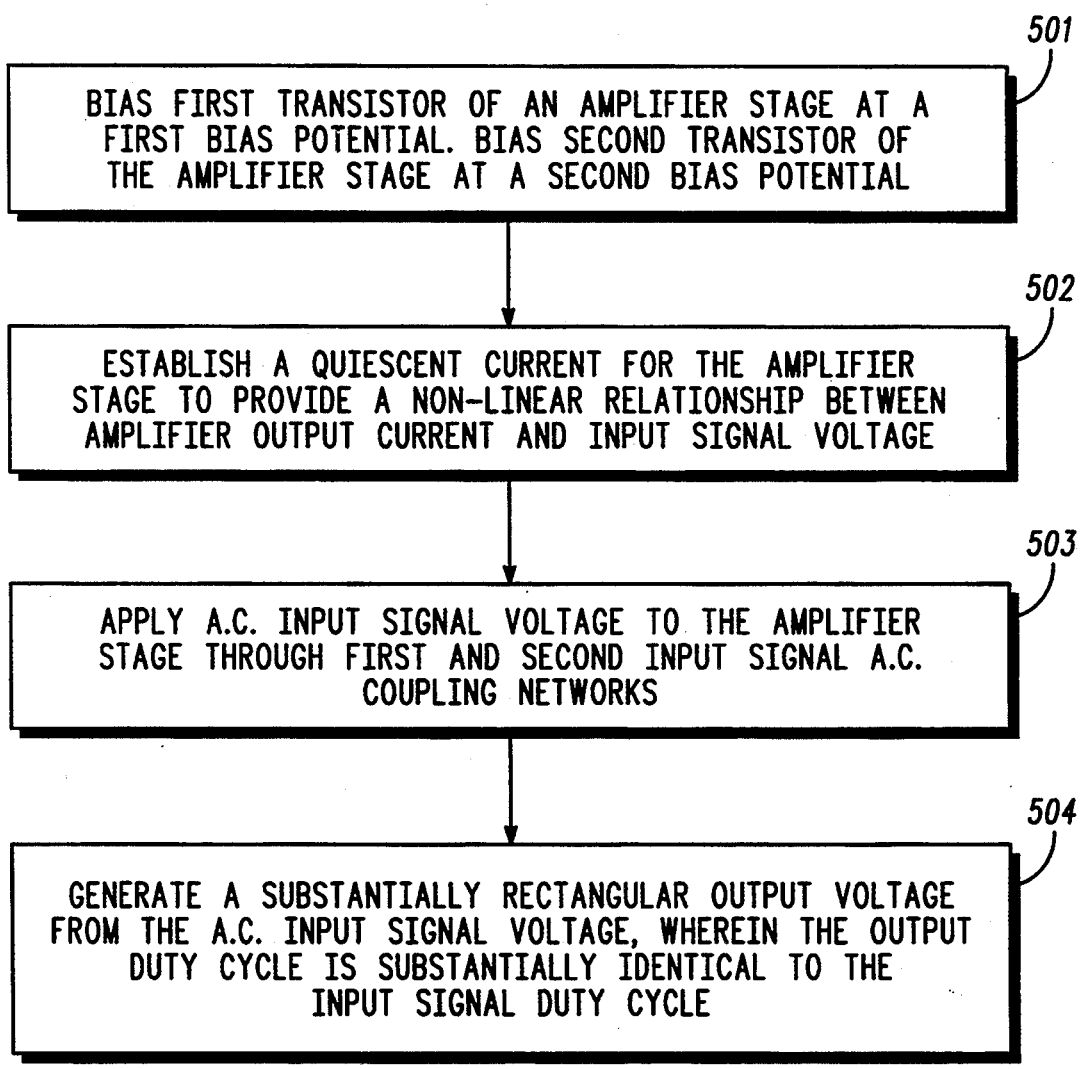
FIG. 5 is a flowchart of method steps in accordance with the present invention.

FIG. 5 is a flowchart of a method in accordance with the present invention. First, in block 501, two complementary transistors must be connected in a push-pull configuration to form an amplifier. The first transistor of the amplifier is biased at a first bias potential near the first transistor's threshold. The second transistor of the amplifier is biased at a second bias potential near the second transistor's threshold. Biasing the first and second transistors at first and second bias potentials, near their respective thresholds, establishes a quiescent current for the amplifier that provides a non-linear relationship between the amplifier's output current and the amplifier's input voltage (block 502). Next, establish an a.c. input signal coupling network such that the signals at the inputs of the transistors retain the a.c. characteristics of an a.c. input signal, but have mean values equal to the first and second bias voltages. Then, as related in block 503, apply an a.c. input signal to the two transistor amplifier through the input signal coupling network. In the next step (504), a substantially rectangular output signal is generated from the a.c. input signal, wherein the output duty cycle is substantially identical to the input signal duty cycle.

Figure 1:
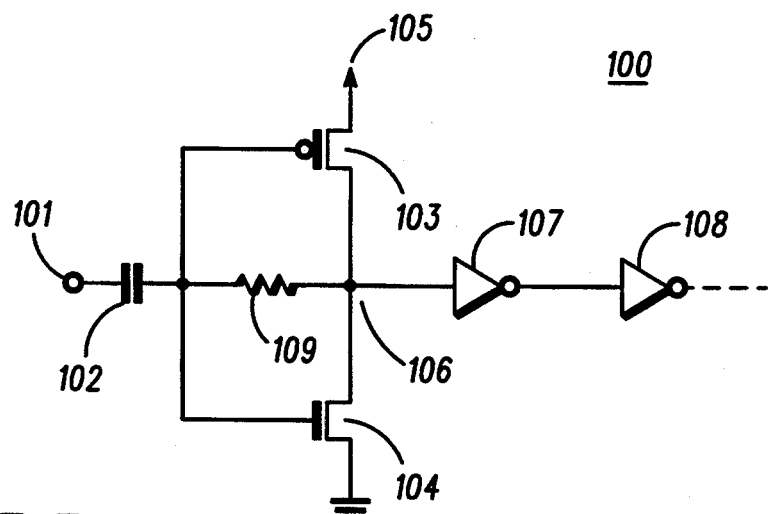
FIG. 1 is a schematic diagram of a squaring amplifier of the prior art.
Figure 2:
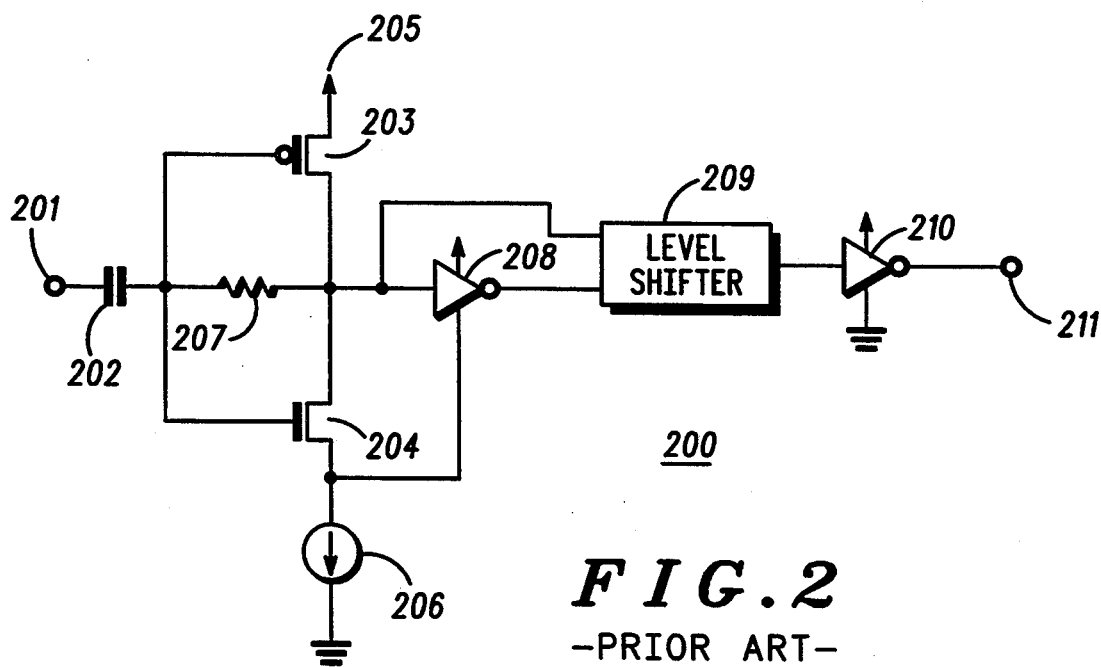
FIG. 2 is a schematic diagram of another squaring amplifier of the prior art.
Figure 6:
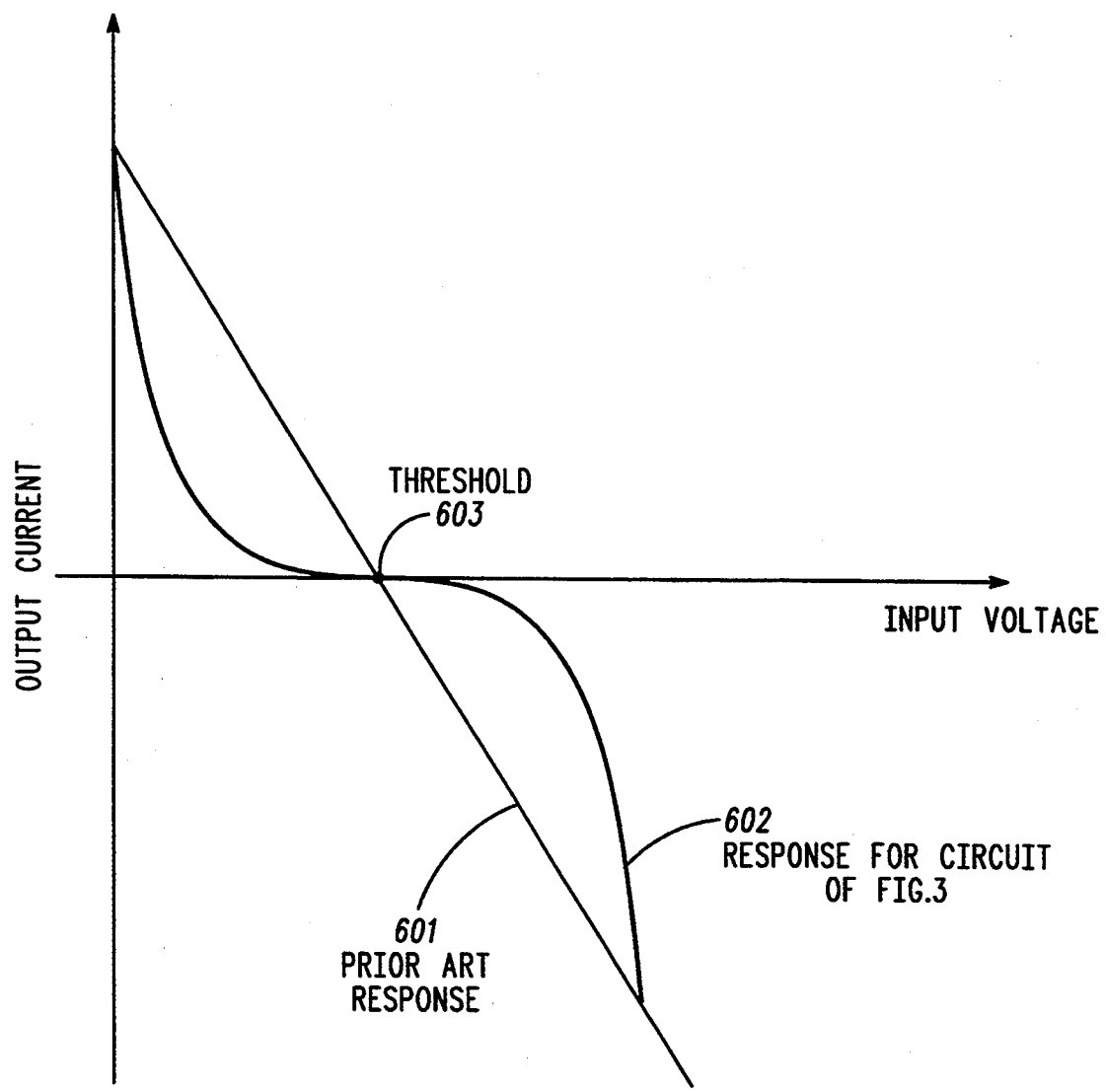
FIG. 6 illustrates the output current versus input voltage characteristic of the circuit of FIG. 3 as compared with that of circuits of the prior art.

The relationship between input voltage and output current for the apparatus of the present invention is illustrated in the graph of FIG. 6. The output current versus input voltage characteristic for a squaring amplifier circuit of the prior art (FIG. 1) is depicted by the straight line curve (601). The output current versus input voltage characteristic for the apparatus of the present invention (FIG. 3) is depicted by the square-law curve (602). In the prior art (FIG. 1), each respective transistor's output current is proportional to the square of its input voltage. Since the bias voltage which is the mean value of the a.c. input signal is the same for both transistors, as the drain current of the p-channel FET increases, the drain current of the n-channel FET decreases. The output current is equal to the difference between the p-channel FET drain current and the n-channel FET drain current. At the quiescent point, the drain currents of the p-channel FET and the n-channel FET are equal (but significant), and the output current is zero. As the a.c. input voltage begins to increase above the mean, the p-channel FET drain current decreases according to the square-law and the n-channel FET drain current increases according to the square-law. However, since the quiescent current is not close to zero, the difference between the p-channel FET drain current and the n-channel FET drain current is linear, as shown by curve 602.

In the circuit of FIG. 3, each respective transistor's output current is proportional to the square of its input voltage. The bias voltage for each transistor is approximately the threshold voltage for that transistor. As the a.c. signal applied to the gate of the p-channel FET begins to increase above its mean (bias voltage 1) the drain current of the p-channel FET decreases; however, since the drain current is virtually zero, the change is small. As the a.c. signal applied to the gate of the n-channel FET begins to increase above its mean (bias voltage 1), the drain current of the n-channel FET increases according to the square-law. The output current is equal to the difference between the p-channel FET drain current and the n-channel FET drain current. At the quiescent point, the drain currents of the p-channel FET and the n-channel FET are equal (and virtually zero), and the output current is zero. As the a.c. input voltage begins to increase above the respective means, the p-channel FET drain current remains relatively unchanged and the n-channel FET drain current increases according to the square-law. The difference between the p-channel FET drain current and the n-channel FET drain current is then a square-law relationship. This non-linear relationship provides the improved noise immunity without duty cycle corruption as detailed in the description of FIG. 3. It also lends itself to very low current consumption since the quiescent current is virtually zero.

What is claimed is:

1. A squaring amplifier circuit comprising:
   a biasing network including:
   a common current source;
   a coupling network operably coupled to the common current source to provide a first bias voltage and a second bias voltage;
   an amplifier stage having a first transistor and a second transistor, with the first bias voltage coupled to the first transistor and the second bias voltage coupled to the second transistor to provide push-pull operation;
   an input signal coupling network, including a first coupling component and a second coupling component, that a.c. couples an a.c. input signal to the first transistor and the second transistor, respectively;

a load coupled to the amplifier stage having an electrical reactance to provide a substantially rectangular output signal retaining input signal duty cycle of the a.c. input signal.

2. The squaring amplifier circuit of claim 1, wherein one of the first transistor and the second transistor of the amplifier stage is a p-channel FET.

3. The squaring amplifier circuit of claim 1, wherein one of the first transistor and the second transistor of the amplifier stage is an n-channel FET.

4. The squaring amplifier circuit of claim 1, wherein the coupling network providing the first bias voltage and the second bias voltage comprises a first resistor and a second resistor, and the input signal coupling network comprises a first capacitor and a second capacitor.

5. The squaring amplifier circuit of claim 4, wherein the first resistor and the second resistor, and the first capacitor and the second capacitor, are adjusted in value to compensate for differences between the first transistor and the second transistor of the amplifier stage.

6. The squaring amplifier circuit of claim 5, wherein compensating for differences between the first transistor and the second transistor comprises providing substantially identical input signal amplitudes to the first transistor and the second transistor.

7. The squaring amplifier circuit of claim 1, wherein the first transistor and the second transistor of the amplifier stage are connected in series.

8. The squaring amplifier circuit of claim 1, wherein the load coupled to the amplifier stage is a gain stage.

9. The squaring amplifier circuit of claim 8, wherein the electrical reactance of the load is an intrinsic capacitor in the gain stage input.

10. The squaring amplifier circuit of claim 8, wherein the gain stage is an inverter.

11. The squaring amplifier circuit of claim 1, wherein the common current source provides substantially identical currents in the first transistor and the second transistor of the amplifier stage.

12. The squaring amplifier circuit of claim 1, wherein the circuit is connected to a d.c. supply voltage having a predetermined value, and to ground potential.

13. The squaring amplifier circuit of claim 12, wherein, when the a.c. input signal has a relatively small amplitude, the substantially rectangular output signal has maximum and minimum amplitude excursions substantially equal to the predetermined value of the d.c. supply voltage and to ground potential, respectively.

14. A method for generating a substantially rectangular output signal from an a.c. input signal voltage, the method comprising the steps of:
(a) biasing a first transistor of an amplifier stage at a first bias potential, and biasing a second transistor of the amplifier stage at a second bias potential using a biasing network having a common current source;
(b) establishing a quiescent current for the amplifier stage to provide a non-linear relationship between amplifier output current and the input signal voltage.
(c) applying the a.c. input signal voltage to the amplifier stage through first and second input signal a.c. coupling networks; and
(d) generating a substantially rectangular output voltage from the a.c. input signal voltage, wherein the substantially rectangular output voltage has a substantially identical duty cycle to a duty cycle of the input signal voltage.

15. The method in accordance with claim 14, wherein the step (a) of biasing includes providing said common current source and a coupling network.

16. The method in accordance with claim 14, wherein the step (a) of biasing further includes providing substantially identical currents in the first transistor and the second transistor of the amplifier stage.

* * * * *